United States Patent [19]

Hamaguchi et al.

[11] 4,317,958
[45] Mar. 2, 1982

[54] NOISE REDUCING CIRCUIT FOR CTD DELAY LINE

[75] Inventors: Kenji Hamaguchi; Mitsuru Hosoya, both of Kanagawa, Japan

[73] Assignee: Sony Corporation, Tokyo, Japan

[21] Appl. No.: 109,339

[22] Filed: Jan. 3, 1980

[30] Foreign Application Priority Data

Jan. 17, 1979 [JP] Japan .................................. 54/4296

[51] Int. Cl.³ ............................................. H04S 1/00
[52] U.S. Cl. .................................. 179/1 G; 307/607; 307/221 D; 333/165
[58] Field of Search .................... 179/1 G, 1 GD, 1 J, 179/1 D, 1 GP; 307/293, 607, 221 D; 333/165; 369/88

[56] References Cited

U.S. PATENT DOCUMENTS

| | | | |
|---|---|---|---|
| 3,236,949 | 2/1966 | Atal et al. | 179/1 G |
| 4,218,585 | 8/1980 | Carver | 179/1 G |

FOREIGN PATENT DOCUMENTS

54-7901 1/1979 Japan .................................. 179/1 G

Primary Examiner—Douglas W. Olms
Attorney, Agent, or Firm—Lewis H. Eslinger; Alvin Sinderbrand

[57] ABSTRACT

In a delay circuit for delaying an input signal having a range extending over a higher- and a lower-frequency region, and in which a charge transfer device, such a bucket-brigade device, transfers a signal from an input to an output thereof in response to a clocking signal applied to the charge transfer device; a pre-emphasis circuit in advance of the charge transfer device emphasizes the input signal in its higher-frequency region, and a de-emphasis circuit after the charge transfer device emphasizes the signal at the output of the device in the lower-frequency region of the signal to compensate for the emphasis provided by the pre-emphasis circuit so that the delay circuit has a total response that is substantially flat. Such a delay circuit can be included in a stereophonic sound extending circuit to delay, by several milliseconds, one of left- and right-channel signals applied to a matrix circuit which provides extended signal components formed by combining each one of the left- and right-channel signals with a phase-inverted version of the other signal.

4 Claims, 4 Drawing Figures

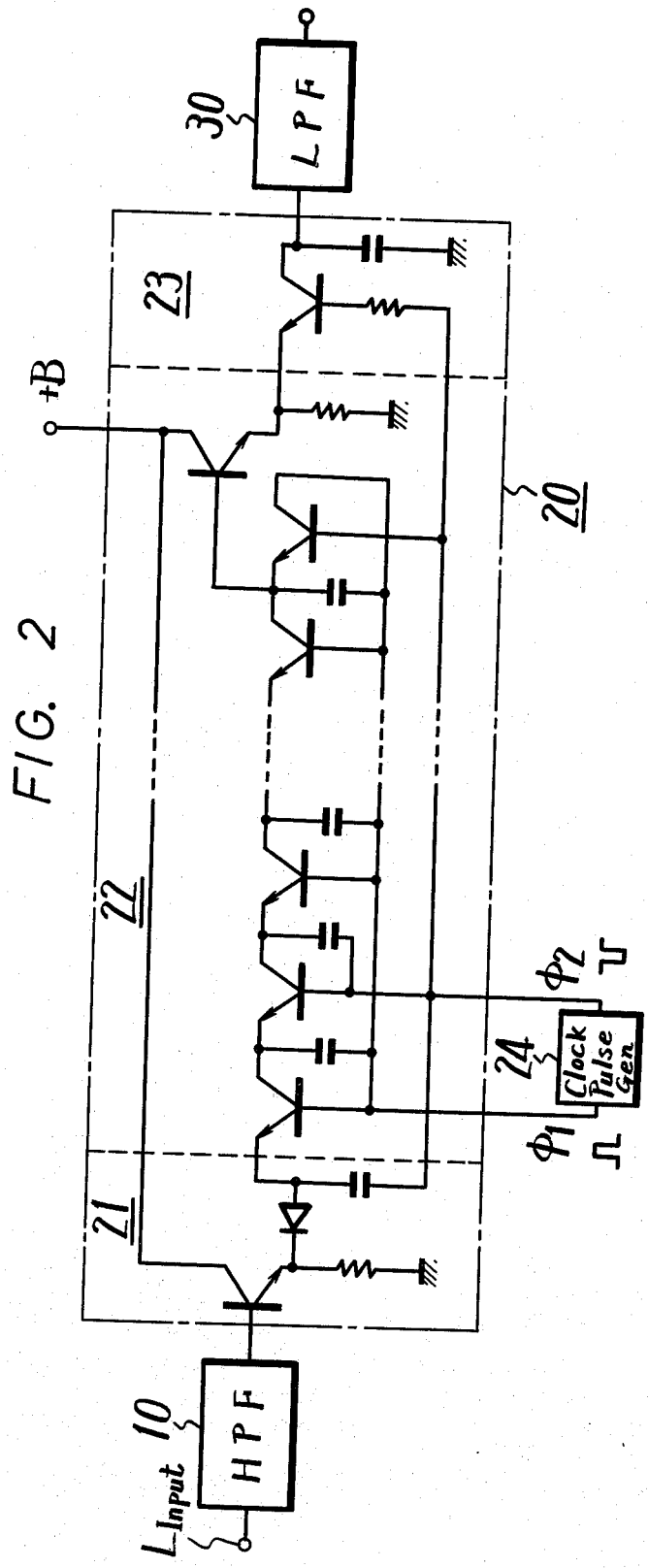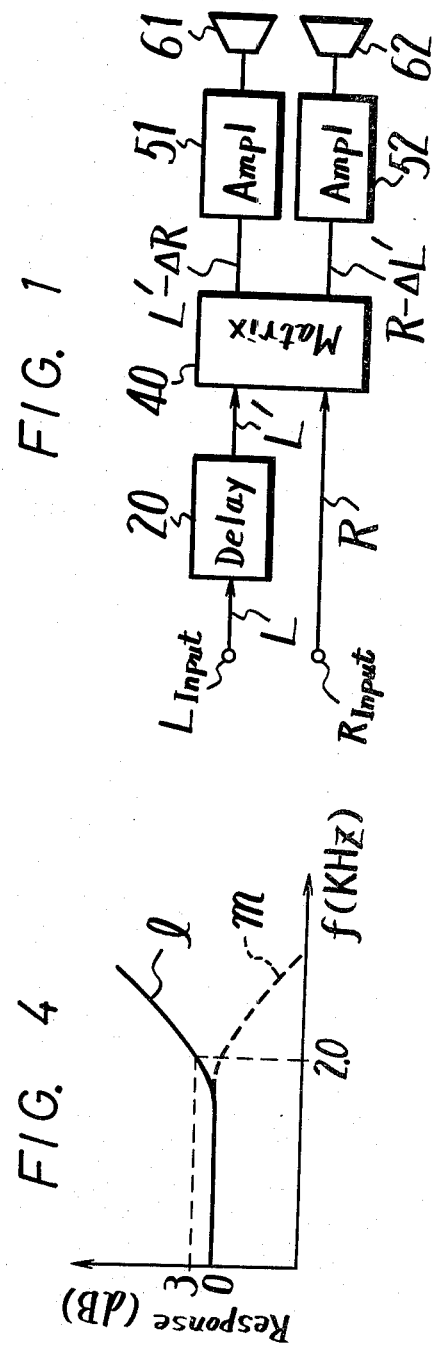

NOISE REDUCING CIRCUIT FOR CTD DELAY LINE

BACKGROUND OF THE INVENTION

1. Field of the Invention

The present invention relates generally to a CTD (charge transfer device) delay circuit and is directed more particularly to a CTD delay circuit suitable for use with a sterophonic sound extending circuit.

2. Description of the Prior Art

As shown in FIG. 1, a conventional stereophonic sound extending circuit, which emphasizes the separation of a stereophonic sound field, is formed of a matrix circuit 40 and a delay circuit or delay line 20.

Left and right channels, respectively, are provided between a left signal input terminal $L_{Input}$ and the matrix circuit 40 and between a right signal input terminal $R_{Input}$ and the matrix circuit 40. The delay line 20 is included in one or the other of the input channels (here shown in the left channel).

A left signal L, appearing at terminal $L_{Input}$ and provided to the delay line 20, is delayed and supplied as a delayed left signal L' to the matrix circuit 40. A right signal R appearing at the right signal input terminal $R_{Input}$, is also applied to the matrix circuit 40, and the latter forms a composite signal $L'-\Delta R$ by combining the left signal L' and a right stereo-enhancing signal $-\Delta R$ which is proportional to the right signal R but is phase-inverted therefrom by 180° and delivers the composite signal $L'-\Delta R$ at one output terminal to an amplifier 51 which amplifies and supplies the composite signal to a left speaker 61. Similary, the right signal R from the input terminal $R_{Input}$ and a version of the phase-inverted delayed left signal $\Delta L'$ are combined in the matrix circuit 40 to form another composite signal $R-\Delta L'$ which is then supplied to an amplifier 52, where it is amplified and then fed to a right speaker 62.

When the signals applied to the input terminals $L_{Input}$ and $R_{Input}$ are stereophonic signals, the amount of stereophonic realism can be enhanced by increasing the amplitude of the phase inverted stereo-enhancing components $\Delta R$ and $\Delta L$, the stereophonic sense can be emphasized. Such a technique is disclosed in U.S. Pat. No. 3,249,696, issued May 3, 1966 to Robert S. Van Sickle.

It is also known to apply a technique known as "delay stereophony" to make the sound on one channel seem deeper, or farther away, than the sound on the other channel. Thus, if monaural audio signals are applied to the input terminals $L_{Input}$ and $R_{Input}$, the delay imparted by delay 20 to the signal on the left channel will bring about a quasi-stereophonic effect wherein the three-dimensional presence of the sound is improved.

OBJECTS AND SUMMARY OF THE INVENTION

Accordingly, an object of the present invention is to provide a delay circuit which is used in a stereophonic sound extending circuit and achieves a superior response characteristic.

Another object of the invention is to provide a delay circuit using a CTD (charge transfer device) such as a BBD (bucket brigade device), CCD (charge coupled device) or the like so that its signal-to-noise ratio is significantly improved.

A further object of the invention is to provide a delay circuit using a CTD in which a high pass filter serving as a pre-emphasis circuit is connected to the signal input terminal of the delay circuit and a low pass filter serving as a de-emphasis circuit is connected to the signal output terminal of the delay circuit.

According to an aspect of the present invention, a delay circuit for delaying an input signal having a range extending over a higher- and a lower-frequency region, and in which a charge transfer device, such as a bucket-brigade device, transfers a signal from an input to an output thereof in response to a clocking signal applied to the charge transfer device; also includes a pre-emphasis circuit in advance of the charge transfer device for emphasizing the input signal in its higher-frequency region, and a de-emphasis circuit after the charge transfer device for emphasizing the signal at the output thereof in the lower-frequency region of the signal to compensate for the emphasis provided by the preemphasis circuit so that the delay circuit has a total response that is substantially flat.

According to another aspect of the present invention, a stereophonic sound extending circuit utilizes the above-mentioned delay circuit to delay, by several milliseconds, one of the left- and right-channel signals applied to a matrix circuit which provides sound-extended signal components formed by combining each one of the left- and right-channel signals with a phase-inverted version of the other signal, thereby to enhance the three-dimensional presence of the stereophonic sound provided by the extended signal components.

Other objects, features and advantages of the present invention will become apparent from the following description taken in conjunction with the accompanying drawings, through-out which like reference characters identify the same elements. BRIEF DESCRIPTION OF THE DRAWINGS FIG. 1 is a block diagram showing a prior art stereophonic sound extending circuit;

FIG. 2 is a connection diagram showing a delay circuit which the present invention is employed;

FIG. 4 is a graph showing frequency response characteristics of pre-emphasis and de-emphasis circuits used in the present invention.

DESCRIPTION OF THE PREFERRED EMBODIMENT

Figure 3:
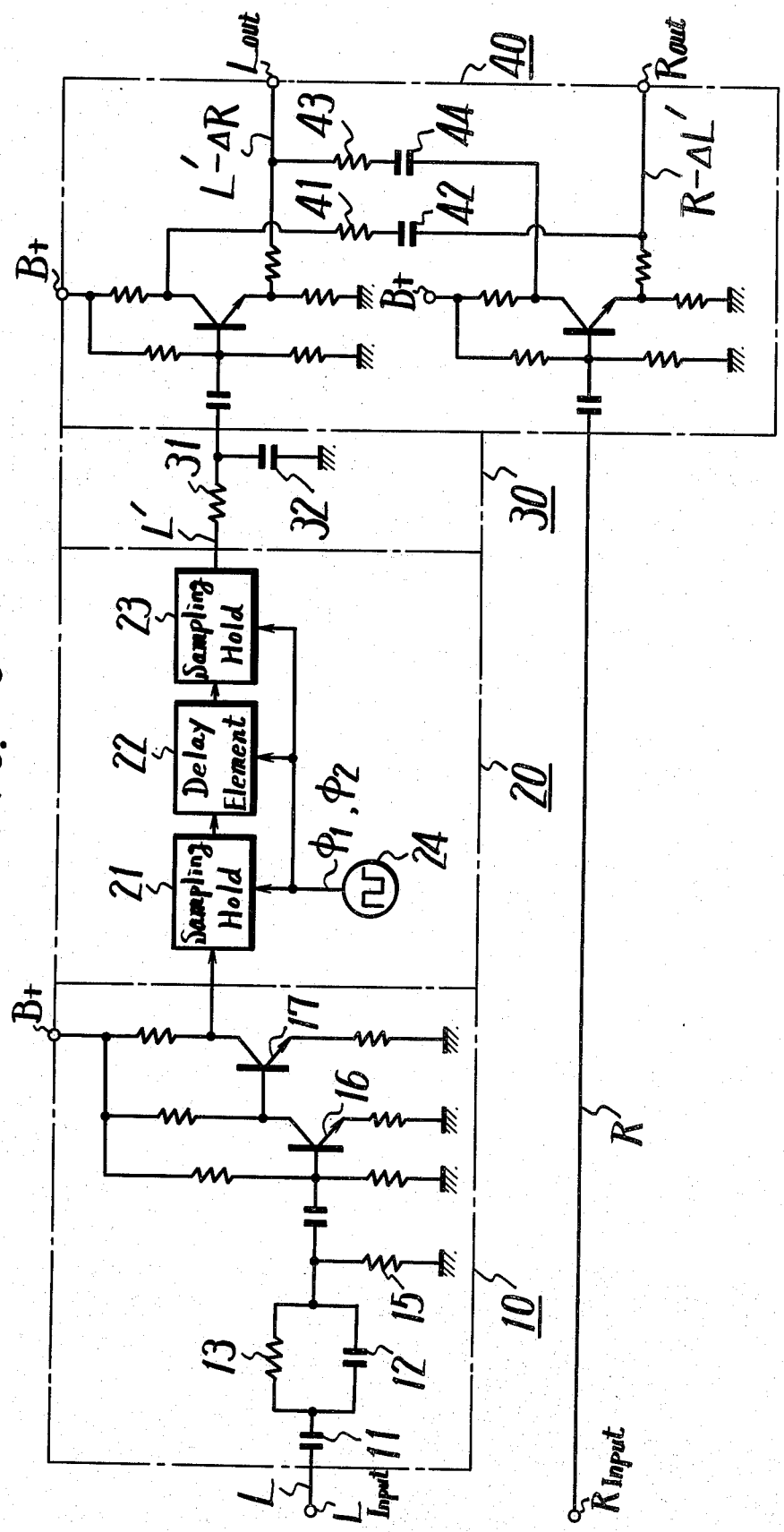
FIG. 3 is a connections diagram showing essential parts of a preferred embodiment of the invention.

With reference to the drawings, and especially to FIGS. 2 and 3 thereof, a stereophonic sound extending circuit has delay circuit 20 which includes a delay element 22 such as a BBD (Bucket-Brigade Device) made of bi-polar transistors. A signal applied to an input terminal $L_{Input}$, and thence through a high pass filter 10 to a first sampling hold circuit 21 to the delay element 22. A clock pulse generator 24 produces rectangular clock pulses $\phi 1$ and $\phi 2$, which are inverted in phase with respect to one another, and supplies these clock pulses to the delay element 22, and supplies clock signal $\phi 2$ to the first sampling hold circuit 21.

The signal delayed by the delay element 22 is sampled and held in a second sampling hold circuit 23. The clock signal frequency components of the delayed signal are removed in the second sampling hold circuit 23.

Because the delay element 22 is in the form of a BBD or other charge transfer device CTD the delay circuit 20 will have a delay time $T_D$ that is determined by the number of stages n of the delay element 22 and by the frequency $f_{CK}$ of the clock pulses $\phi 1$ and $\phi 2$ which drive the delay element 22 according to a relationship which can be expressed as follows:

$$T_D = n/f_{CK} \qquad (1)$$

The use of delay stereophony in a sound-extending circuit to establish a sufficient stereophonic sound requires that the delay time $T_D$ in the stereophonic sond extending circuit must be selected to be more than several milliseconds (msec). Therefore, according to the relation (1), the number n of stages can be chosen high enough or the clock frequency $f_{CK}$ can be chosen low enouth so that the delay time $T_D$ is sufficiently long. However, it is a characteristic of the BBD that if the number n of stages is increased, the signal-to-noise ratio of the delayed signal becomes degraded, but if a lowered clock frequency $f_{Ck}$ is utilized instead of an increased number n, the pass band width of the BBD for a signal passing therethrough becomes narrow, as is apparent from an analysis of the BBD according to sampling theory, and, furthermore, the high-frequency portion of the signal will be unduly attenuated.

The present invention has its foundation in that the noise component generated in the BBD itself is distributed mostly in the high frequency region and thus the signal-to-noise ratio of the delayed signal can be improved by providing a pre-emphasis circuit at the front, or input of the delay circuit 20 and a de-emphasis circuit at the rear, or output of the delay circuit 20.

In the embodiment of the invention shown in FIG. 3 in which the same reference numerals as those used in FIG. 2 identify the same elements, a high pass filter which 10 forms the above-mentioned pre-emphasis circuit. This high pass filter 10 includes capacitors 11, 12, resistors 13, 15, and transistors 16, 17. The transistor 16 amplifies an input signal so that its high frequency region is emphasized, while the transistor 17 inverts the phase of the signal from the transistor 16 and supplies the phase-inverted signal to the delay circuit 20.

In the graph of FIG. 4, a solid line curve l shows the pre-emphasis of frequency response characteristic of high pass filter 10. It is apparent from a consideration of curve l that the response of the high-pass filter 10 shown in the example in FIG. 3 is flat in the frequency range of about 0 and 2 KHz, is emphasized by 3 dB 2 KHz, and also is further emphasized so that the curve l has a gradient of 6.0 dB/oct as the frequency increases above 2 KHz.

The signal delayed by the delay circuit 20 is reformed into a signal having the frequency characteristic of the original signal by means of a low pass filter 30 serving as a de-emphasis circuit as mentioned above. As shown in FIG. 3, the de-emphasis circuit or low pass filter 30 is formed of a resistor 31 and a capcitor 32 and has the characteristic shown by broken-line curve m in the graph of FIG. 4.

When the signal-to-noise ratio is measured for of the embodiment of the invention described above, wherein the number n of stages and the clock frequency $f_{CK}$ are kept constant, the signal-to-noise ratio is about 11 dB higher than for comparable circuits according to the prior art.

By way of example, the circuit values of the above-described embodiment of the invention can be selected as follows:

| Capacitor | 11 | 1 μF |
| Capacitor | 12 | 1500 pF |
| Capacitor | 32 | 5600 pF |
| Resistor | 13 | 51 KΩ |
| Resistor | 15 | 5.6 KΩ |
| Resistor | 31 | 1 KΩ |

As further depicted in FIG. 3, a matrix circuit 40 includes capacitors 42, 44 and resistors 41, 43. In the matrix circuit 40, the inverted components $\Delta R, -\Delta L'$ of the resspective stereophonic signals are added to the opposite signals L'R through the capacitors 42 and 44. The resistors 41 and 43 determine the relative amplitude of the added components.

In FIG. 3, $L_{out}$ and $R_{out}$ represent the output terminals of the matrix circuit 40, respectively, at which sound-extended sterophonic signals $L'-\Delta R$ and $R-\Delta L'$ appear.

These sound-extended signals correspond to the stereo enhanced composite signal of the circuit of FIG. 1.

As described above, according to the present invention, since the signal-to-noise ratio of the delayed signal can be improved without narrowingd the pass band width of the signal, if the present invention is applied to a stereophonic sound extending circuit, the signal-to-noise ratio can be improved, good sound quality can be achieved, and three-dimensional presence and stereophonic sense can be realized.

The present invention can particularly be applied to advantage in a television receiver receiving a sound multiplexed broadcast wave and having left and right speakers that are not widely separated from one another. Although it is difficult according to the prior art to extend the stereophonic sound in such a television receiver, the circuit of the present invention is particularly suitable as the stereophonic sound extending circuit of the television receiver.

It will be apparent that many modifications and variations can be effected by one skilled in the art without departing from the spirit or scope of the present invention which is to be determined by the appended claims.

We claim as our invention:

1. A delay circuit for delaying a signal extending from a lower frequency region to a higher frequency region, comprising: a charge transfer device having an input, a series of stages and an output and being operative to transfer a signal from said input to said output in response to a clock signal applied to said stages; clocking means for supplying said clock signal to said charge transfer device; preemphasis means for emphasizing said signal in said higher frequency region before application thereof to said input; and deemphasis means for emphasizing said signal in said lower frequency region at said output of said charge transfer device to compensate for the emphasis of said preemphasis means so that the delay circuit has a total response that is substantially flat.

2. A delay circuit according to claim 1, wherein said charge transfer device is a bucket-brigade device.

3. A stereophonic sound extending circuit comprising:

matrix circuit means receiving first and second stereophonic channel signals and producing a first sound-extended signal formed from said first stereophonic channel signal and a phase-inverted version of said second stereophonic channel signal and a second sound-extended signal formed from said second stereophonic channel signal and a phase-inverted version of said first stereophonic channel signal; and delay means in advance of said matrix circuit means for delaying said first channel stereophonic signal including a charge transfer device, preemphasis means in advance of said charge transfer device for emphasizing a portion of said first stereophonic channel signal, and deemphasis means between said charge transfer device and said matrix circuit means for providing an amount of deemphasis complementary to the emphasis afforded by said preemphasis means.

4. A stereophonic sound extending circuit according to claim 3; wherein said first and second stereophonic channel signals are multiplex stereophonic sound signals derived from a received television signal.

* * * * *